US 6,728,037 B2

(12) United States Patent
Shiraishi

(10) Patent No.: US 6,728,037 B2
(45) Date of Patent: Apr. 27, 2004

(54) MULTILAYER-COATED REFLECTIVE MIRRORS FOR X-RAY OPTICAL SYSTEMS, AND METHODS FOR PRODUCING SAME

(75) Inventor: Masayuki Shiraishi, Machida (JP)

(73) Assignee: Nikon Corporation, Toyko (JP)

( * ) Notice: Subject to any disclaimer, the term of this patent is extended or adjusted under 35 U.S.C. 154(b) by 0 days.

(21) Appl. No.: 10/196,528

(22) Filed: Jul. 15, 2002

(65) Prior Publication Data

US 2003/0039042 A1 Feb. 27, 2003

(30) Foreign Application Priority Data

Jul. 31, 2001 (JP) ........................................ 2001-232575

(51) Int. Cl.$^7$ ................................................ G02B 1/10
(52) U.S. Cl. ...................... 359/584; 359/580; 359/360; 359/585; 378/84; 378/34
(58) Field of Search ................................ 359/584, 585, 359/580, 589, 360, 361, 586, 587; 378/84, 34, 85; 428/544, 615

(56) References Cited

U.S. PATENT DOCUMENTS 5,958,605 A * 9/1999 Montcalm et al. .......... 428/627
6,160,867 A 12/2000 Murakami
6,228,512 B1 5/2001 Bajt et al.

OTHER PUBLICATIONS

Mirkarimi et al., "Advances in the reduction and compensation of film stress in high–reflectance multilayer coatings for extreme ultraviolet lithography." Proceedings *SPIE*, vol. 3331, pp. 133–148, 1998.
European Search Report, dated Nov. 12, 2002, for corresponding EP application No. EP02015615.
Nguyen et al., "Achievement of Low Stress in Mo/Si Multilayer Mirrors," *OSA Technical Digest, Paper MC4*, pp. 28–31, 1994.
Kloidt et al., "Smoothing of interfaces in ultrathin Mo/Si multilayers by ion bombardment," *Thin Solid Films* 228:154–157, 1993.
Louis et al., "Enhancement of reflectivity of multilayer mirrors for soft x–ray projection lithography by temperature optimization and ion bombardment," *Microelectronic Engineering* 23:215–218, 1994.
Schlatmann et al., "Modification by Ar and Kr ion bombardment of Mo/Si X–ray multilayers," *Applied Surface Science* 78: 147–157, 1994.
Spiller, "Enhancement of the Reflectivity of Multilayer X–Ray Mirrors by Ion Polishing," *Proceedings SPIE* 1160:271–279, 1989.
Voorma et al., "Angular and energy dependence of ion bombardment of Mo/Si multilayers," *J. Appl. Phys.* 82(4):1876–1881, 1997.
Shaheen et al., "Evolution of atomic–scale surface structures during ion bombardment: A fractal simulation," *J. Vac. Sci. Technol.* 11(6):3085–3091, 1993.
Spiller, "Smoothing of multilayer x–ray mirrors by ion polishing," *Appl. Phys. Lett.* 54(23):2293–2295, 1989.

* cited by examiner

*Primary Examiner*—Drew Dunn
*Assistant Examiner*—Fayez Assaf
(74) *Attorney, Agent, or Firm*—Klarquist Sparkman LLP

(57) ABSTRACT

Multilayer-film mirrors are disclosed that include multiple units of Mo and Si layers formed on the surface of a mirror substrate and that exhibit reduced internal stress and hence improved imaging properties. Hence, the mirrors are especially suitable for use in X-ray optical systems such as used in X-ray lithography systems. In an exemplary mirror, a molybdenum oxide layer is formed on at least one Mo layer at the interface surface between the Mo layer and an adjacent Si layer. The molybdenum oxide layer is formed by irradiation with oxygen ions, or by forming at least a portion of the Mo layer in an atmosphere including oxygen.

9 Claims, 1 Drawing Sheet

MULTILAYER-COATED REFLECTIVE MIRRORS FOR X-RAY OPTICAL SYSTEMS, AND METHODS FOR PRODUCING SAME

FIELD

This disclosure pertains to X-ray optical systems, encompassing such systems as used in X-ray telescopes, X-ray laser systems, and X-ray microlithography systems. More specifically, the disclosure pertains to multilayer-coated mirrors as used in X-ray optical systems. By "X-ray" is meant not only the so-called "hard" X-ray wavelengths of about 1 nm or less, but also the so-called "soft" X-ray wavelengths of about 20 nm to about 1 nm.

BACKGROUND

The complex refractive index of a substance is expressed by Equation (1), below. Since both $\delta$ and k are substantially less than unity within the wavelength range encompassed by the X-ray wavelengths, reflective-optical systems are used in X-ray optical systems.

$$n = 1 - \delta - i \cdot k \qquad (1)$$

In the case of oblique-incidence optical systems exploiting full X-ray reflection, the critical angle of total reflection, $\theta_c$ is extremely small. As a result, reflectivity is extremely small at angles of incidence near perpendicular. Hence, multilayer-coated mirrors are used in reflective optical systems for use with X-ray wavelengths. Multilayer-coated mirrors are made by alternatingly laminating two types of substances on the surface of a mirror substrate. The substances are selected so as to exhibit high-amplitude reflectivity at the boundary. The thickness of each of the layers is established based on light-interference theory such that the waves of X-ray light reflected by the respective layer boundaries surfaces interfere constructively. With respect to one of the selected substances, the difference between its refractive index in the X-ray wavelength range in which the mirror is to be used and its refractive index in a vacuum (n=1) is small. The other substance is one in which this difference is large.

Since multilayer-coated mirrors are capable of reflecting perpendicularly incident X-rays, such mirrors can be used in X-ray optical systems that employ perpendicular reflection to yield lower aberrations than exhibited by oblique-incidence optical systems relying on total reflection. Also, a multilayer-coated mirror exhibits wavelength selectivity by strongly reflecting X-rays whenever Bragg's condition, expressed by Equation (2), is met.

$$2d \cdot \sin \theta = m \cdot \lambda \qquad (2)$$

In Equation (2), d is the period length of the multilayer coating, $\theta$ is the oblique angle of incidence, $\lambda$ is the X-ray wavelength, and m is the order.

A well-known example of a multilayer coating is a W/C multilayer coating, in which tungsten (W) and carbon (C) are alternatingly laminated on the mirror substrate. Another well-known example is a Mo/C multilayer coating, in which molybdenum (Mo) and carbon are alternatingly laminated on the mirror substrate. These multilayer coatings are formed by thin-film-formation techniques, such as sputtering, vacuum deposition, or chemical vapor deposition (CVD).

Among several types of multilayer coatings that could be used for the soft X-ray wavelengths, Mo/Si multilayer coatings exhibit high reflectivity at the long L-absorption end of the wavelength spectrum of Si (12.6 nm wavelength). Thus, multilayer coatings easily can be produced that exhibit greater than 60% reflectivity (at perpendicular incidence) to soft-X-ray wavelengths of approximately 13 nm. Reflective mirrors having Mo/Si multilayer coatings currently are being used in research applications such as X-ray telescopes and X-ray laser resonators, and these mirrors also are being actively considered for use in reduction-projection microlithography systems that use soft X-rays. These soft X-rays also are termed "extreme ultraviolet" (EUV) light, and microlithography systems utilizing this wavelength range of light are called extreme ultraviolet lithography (EUVL) systems.

Whereas high-reflectivity Mo/Si multilayer-coated mirrors can be produced by sputtering, thin films formed by sputtering generally are subject to internal compressive stress (Sey-Shing Sun: *J. Vac. Sci. Technol.* A4(3), May/June 1986). As a result, in multilayer-film mirrors made using this technique, problems arise due to the internal stress that develops in the Mo/Si multilayer coating. This stress causes deformation of the mirror substrate, which produces wavefront aberrations in the X-ray optical system and corresponding decreases in optical performance of the mirror.

SUMMARY

In view of the shortcomings of the prior art as summarized above, the present invention provides, inter alia, multilayer-coated mirrors that exhibit decreased internal stress in the multilayer coatings, thereby providing multilayer-coated mirrors exhibiting better optical performance than conventional multilayer-film mirrors.

According to a first aspect of the invention, multilayer-coated mirrors are provided. A representative embodiment of such a mirror comprises a mirror substrate and a multilayer coating formed on the mirror substrate. The multilayer coating comprises multiple layer units each comprising a respective molybdenum (Mo) layer and a respective silicon (Si) layer. The layer units are formed such that, in the multilayer coating, the Mo layers alternate with the Si layers. At least one of the Mo layers adjacent a respective Si layer includes a molybdenum oxide layer at an interface surface with the adjacent respective Si layer. Desirably, the molybdenum oxide layer is on an interface surface of the Mo layer that faces away from the mirror substrate. Also, the molybdenum oxide layer desirably has a thickness of at least 0.5 nm.

According to another aspect of the invention, methods are provided for manufacturing a multilayer-coated mirror. In an exemplary embodiment of such a method, multiple Mo/Si layer units are formed on a surface of a mirror substrate. Each layer unit comprises a respective Mo layer and a respective Si layer. The layer sets are formed such that, in the multilayer coating, the Mo layers alternate with the Si layers. After forming at least one of the Mo layers, oxygen ions are added to the Mo layer before forming a Si layer over the Mo layer. The oxygen ions can be added by irradiating the Mo layer with oxygen ions. Alternatively, the oxygen ions can be added by providing oxygen gas or ozone gas, producing oxygen ions from said gas, and exposing the Mo layer to the oxygen ions.

In another method embodiment, on a surface of a mirror substrate multiple Mo/Si layer units are formed each comprising a respective Mo layer and a respective Si layer. The layer units are formed such that, in the multilayer coating, the Mo layers alternate with the Si layers. After forming at least one of the Mo layers, an oxygen-containing boundary layer is formed on the Mo layer in presence of an atmosphere comprising oxygen.

The foregoing and additional features and advantages of the invention will be more readily apparent from the following detailed description and the accompanying drawing.

DETAILED DESCRIPTION

Figure 1:
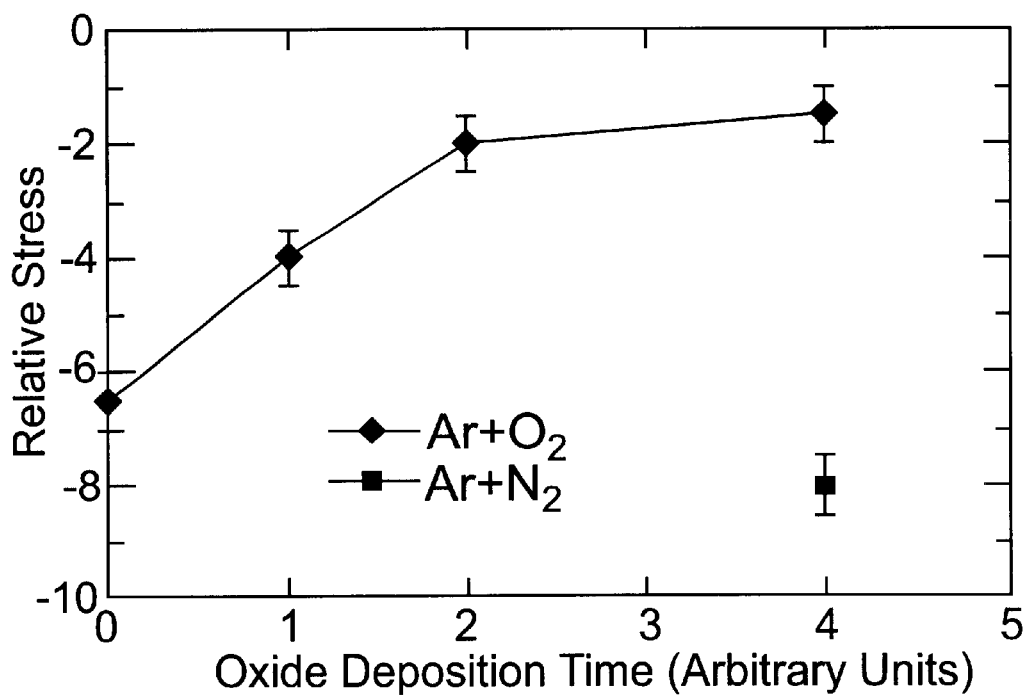
FIG. 1 is a graph of relative stress as a function of molybdenum oxide layer thickness for a multilayer coating that includes a molybdenum layer, a molybdenum oxide layer, and a silicon layer.

Multilayer-film mirrors as described below are based on a discovery that the magnitude of stress in Mo/Si multilayer-coated mirrors can be reduced by including a molybdenum oxide layer at the boundary between a molybdenum layer and a silicon layer. This effect is especially marked whenever the thickness of the molybdenum oxide layer is 0.5 nm or greater. As shown in FIG. 1, a magnitude of a compressive stress in a Mo/Si layer unit decreases as a function of a thickness of a molybdenum oxide layer situated between the Mo layer and the Si layer. In the example of FIG. 1, a layer thickness of about 0.5 nm reduces the magnitude of the compressive stress by a factor of about ⅓.

Several example embodiments are described below, which are not intended to be limiting in any way.

EXAMPLE EMBODIMENT 1

A multilayer-coated mirror according to this example embodiment comprised a Mo/Si multilayer coating formed from multiple respective layer pairs of molybdenum and silicon formed by ion-beam sputtering on a Si substrate. However, prior to forming the Si layer on the Mo layer in each layer pair, the surface of the Mo layer was irradiated with an ion beam. The ion seed for the ion beam was $O_2$ gas. Thus, a surficial molybdenum oxide layer was formed on the Mo layer. The ion-beam irradiation energy was 600 eV. The period length of the multilayer coating was 69 Å, wherein each Mo layer had a thickness of 24 Å and each Si layer had a thickness of 45 Å. The total count of laminae was 40 layer pairs.

Structural analysis of the multilayer coating revealed the presence of oxygen atoms in the surface of each Mo layer that had been irradiated with the oxygen-ion beam, confirming that the surface of each Mo layer had been oxidized before the Si layer was formed. Internal stress in this multilayer coating was −70 MPa. In comparison, the internal stress exhibited by a conventional Mo/Si multilayer coating (i.e., in which the Mo layers were not irradiated with an ion beam) was −400 MPa. Hence, the multilayer-film mirror according to this example embodiment exhibited an internal stress that was ⅙ the internal stress of an otherwise similar conventional multilayer-film mirror.

EXAMPLE EMBODIMENT 2

A multilayer-coated mirror according to this example embodiment comprised a Mo/Si multilayer coating formed from multiple respective layer pairs of molybdenum and silicon formed by ion-beam sputtering on a Si substrate. However, prior to forming the Si layer on the Mo layer in each layer pair, the surface of the Mo layer was irradiated with an ion beam. The ion seed for the ion beam was a mixture of Ar and $O_2$ gas. The Ar gas was supplied to the ion source and the $O_2$ gas was supplied to the ionization chamber. The partial-pressure ratio of Ar gas and $O_2$ gas was 4:1. Thus, a surficial molybdenum oxide layer was formed on the Mo layer. The ion-beam irradiation energy was 600 eV. The period length of the multilayer coating was 68 Å, wherein each Mo layer had a thickness of 24 Å and each Si layer had a thickness of 44 Å. The total count of laminae was 40 layer pairs.

Structural analysis of the multilayer coating revealed the presence of oxygen atoms in the surface of each Mo layer that had been irradiated with the oxygen-ion beam, confirming that the surface of each Mo layer had been oxidized before the Si layer was formed. Internal stress in this multilayer coating was −40 MPa. In comparison, the internal stress exhibited by a conventional Mo/Si multilayer coating (i.e., in which the Mo layers were not irradiated with an ion beam) was −400 MPa. Hence, the multilayer-film mirror according to this example embodiment exhibited an internal stress that was ⅒ the internal stress of an otherwise similar conventional multilayer-film mirror.

EXAMPLE EMBODIMENT 3

A multilayer-coated mirror according to this example embodiment comprised a multilayer coating formed from multiple respective layer units of molybdenum, molybdenum oxide, and silicon formed by ion-beam sputtering on a Si substrate. Unlike conventional Mo/Si multilayer coatings having a 70-Å period and a Mo-layer thickness of 25 Å, each Mo layer in this embodiment was formed by ion-beam sputtering to a thickness of 20 Å. An additional 5 Å was added to each Mo layer as a respective molybdenum oxide layer formed by reactive ion-beam sputtering of Mo in the presence of $O_2$ gas supplied inside the sputtering chamber. A 44-Å Si layer was laminated over each Mo oxide layer. The laminae count comprised 40 layer units, wherein each layer unit comprised three layers: a respective Mo layer, a respective Mo oxide layer, and a respective Si layer. The partial pressure of $O_2$ during formation of each Mo oxide layer was ¼ the partial pressure of the sputtering gas (Ar gas).

Structural analysis of the multilayer coating confirmed the presence of molybdenum and oxygen atoms in each layer formed by reactive sputtering, indicating that each such layer was a Mo oxide layer. Internal stress in this multilayer coating was −65 MPa. In comparison, the internal stress exhibited by a conventional Mo/Si multilayer coating was −400 MPa. Hence, the multilayer-film mirror according to this example embodiment exhibited an internal stress that was ⅙ the internal stress of an otherwise similar conventional multilayer-film mirror.

As indicated above, multilayer-coated mirrors are provided that exhibit reduced internal stress in their multilayer coatings. These low-stress multilayer-coated mirrors are easily manufactured using the methods as described above.

Whereas the invention has been described in connection with multiple example embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A multilayer-coated mirror, comprising:
   a mirror substrate; and
   a multilayer coating formed on the mirror substrate, the multilayer coating comprising multiple layer units each comprising a respective molybdenum (Mo) layer and a respective silicon (Si) layer, the layer units being formed such that, in the multilayer coating, the Mo layers alternate with the Si layers, wherein at least one of the Mo layers adjacent a respective Si layer includes a molybdenum oxide layer at its interface surface with the adjacent respective Si layer.

2. The multilayer-coated mirror of claim 1, wherein the molybdenum oxide layer is on the boundary surface of the Mo layer facing away from the mirror substrate.

3. The multilayer-coated mirror of claim 2, wherein the molybdenum oxide layer has a thickness of at least 0.5 nm.

4. A method for manufacturing a multilayer-coated mirror, comprising:

on a surface of a mirror substrate, forming multiple Mo/Si layer units each comprising a respective molybdenum (Mo) layer and a respective silicon (Si) layer, the layer units being formed such that, in the multilayer coating, the Mo layers alternate with the Si layers; and after forming at least one of the Mo layers, adding oxygen ions to the Mo layer before forming a Si layer over the Mo layer.

5. The method of claim 4, wherein the oxygen ions are added by irradiating the Mo layer with oxygen ions.

6. The method of claim 4, wherein the oxygen ions are added by providing oxygen gas or ozone gas, producing oxygen ions from said gas, and exposing the Mo layer to the oxygen ions.

7. A multilayer-film mirror, produced by the method of claim 4.

8. A method for manufacturing a multilayer-coated mirror, comprising:

on a surface of a mirror substrate, forming multiple Mo/Si layer units each comprising a respective molybdenum (Mo) layer and a respective silicon (Si) layer, the layer units being formed such that, in the multilayer coating, the Mo layers alternate with the Si layers; and after forming at least one of the Mo layers, forming an oxygen-containing boundary layer on the Mo layer in presence of an atmosphere comprising oxygen.

9. A multilayer-film mirror, produced by the method of claim 8.

* * * * *

UNITED STATES PATENT AND TRADEMARK OFFICE
CERTIFICATE OF CORRECTION

PATENT NO. : 6,728,037 B2
DATED : April 27, 2004
INVENTOR(S) : Shiraishi

It is certified that error appears in the above-identified patent and that said Letters Patent is hereby corrected as shown below:

Column 1,
Line 28, "$\theta_c$is" should read -- $\theta_c$, is --.
Line 53, "$2d \cdot \sin\theta = m \cdot \lambda$" should read -- $2d \cdot \sin\theta = m \cdot \lambda$ --.

Column 6,
Lines 17-18, "in presence" should read -- in the presence --.

Signed and Sealed this

Seventh Day of September, 2004

JON W. DUDAS
*Director of the United States Patent and Trademark Office*